(12) United States Patent
Lewis, Jr. et al.

(10) Patent No.: US 9,897,324 B2
(45) Date of Patent: Feb. 20, 2018

(54) COMBINATION EMI SHIELD AND MOUNTING SYSTEM FOR ELECTRONIC CONTROLLED GAS COOKING

(71) Applicant: Electrolux Home Products, Inc., Charlotte, NC (US)

(72) Inventors: George P. Lewis, Jr., Gallatin, TN (US); Gerry McAfee, White House, TN (US); Brian Martin, Springfield, TN (US); Michael Padgett, Springfield, TN (US)

(73) Assignee: Electrolux Home Products, Inc., Charlotte, NC (US)

( * ) Notice: Subject to any disclaimer, the term of this patent is extended or adjusted under 35 U.S.C. 154(b) by 511 days.

(21) Appl. No.: 14/478,136

(22) Filed: Sep. 5, 2014

(65) Prior Publication Data

US 2016/0069571 A1    Mar. 10, 2016

(51) Int. Cl.
*G01R 31/00*    (2006.01)
*F24C 3/12*    (2006.01)
(Continued)

(52) U.S. Cl.
CPC .............. *F24C 3/124* (2013.01); *F24C 3/103* (2013.01); *F24C 3/126* (2013.01); *H05K 9/0007* (2013.01); *H05K 9/0081* (2013.01)

(58) Field of Classification Search
CPC .. G01R 1/18; G01R 1/07342; G01R 1/06711; G01R 1/06772; G01R 1/2886; G01R 1/2889; G01R 1/04; G01R 31/001; G01R 31/002; G01R 29/0835; G01R 29/105; F24C 3/126; F24C 3/103; F24C 3/85; F24C 3/12; F24C 3/128; F24C 3/067; F24C 3/085; F24C 3/027; F24C 3/106;
(Continued)

(56) References Cited

U.S. PATENT DOCUMENTS 4,971,024 A * 11/1990 Albon ..................... F24C 3/085
126/214 A
5,313,928 A *  5/1994 Rodgers .................. A47J 36/26
126/201
(Continued)

OTHER PUBLICATIONS

International Search Report & Written Opinion for PCT/US2015/046057, dated Feb. 16, 2016, 15 pages.
(Continued)

*Primary Examiner* — Thang Le
(74) *Attorney, Agent, or Firm* — Pearne & Gordon LLP

(57) ABSTRACT

An electromagnetic interference (EMI) shield for gas cooktops is disclosed herein. The EMI shield protects electromagnetic fields output by a high voltage spark ignition system from interfering with sensitive low voltage controls for the cooktop. Accordingly, the low voltage controls and similar elements are mounted on one side of the EMI shield and the high voltage spark ignition system, burners, and similar elements are mounted on another side of the EMI shield. In order to connect elements on each side of the EMI shield as may be necessary (e.g., electrical wires and gas tubing), the EMI shield can have a plurality of small openings. The EMI shield may also provide a mount for controls and/or a user interface for displaying information and controlling the cooktop.

8 Claims, 3 Drawing Sheets

(51) Int. Cl.
*H05K 9/00* (2006.01)
*F24C 3/10* (2006.01)

(58) Field of Classification Search
CPC ......... F24C 15/08; F24C 15/10; F23Q 3/008;
F23Q 3/002; F23N 2027/36; F23N
2027/28; F23N 2027/22; F23N 5/065;
F23N 5/10; F23N 5/20
USPC ......... 324/750.26, 750.27, 627, 628, 750.19;
126/39 AB, 39 E, 19 R, 39 H, 39 K, 30 G;
431/264, 43, 72, 78, 80; 99/331, 332,
99/334
See application file for complete search history.

(56) References Cited

U.S. PATENT DOCUMENTS

| | | | |
|---|---|---|---|
| 6,234,161 B1 | 5/2001 | Levi et al. | |
| 6,247,921 B1 | 6/2001 | Helt | |
| 6,382,961 B2 | 5/2002 | Clifford et al. | |
| 7,795,562 B2 | 9/2010 | de Rooij et al. | |
| 7,944,678 B2* | 5/2011 | Kaplan | F23Q 3/004 |
| | | | 361/253 |
| 8,312,873 B2 | 11/2012 | Gagas et al. | |
| 8,823,714 B1 | 9/2014 | Thielvoldt et al. | |
| 8,882,492 B2* | 11/2014 | Querejeta Andueza | F23N 5/146 |
| | | | 137/65 |
| 2005/0089809 A9* | 4/2005 | Repper | F23N 1/005 |
| | | | 431/66 |
| 2009/0035710 A1* | 2/2009 | Peruch | F23N 5/123 |
| | | | 431/255 |
| 2011/0290787 A1* | 12/2011 | Bassill | H05B 6/062 |
| | | | 219/627 |
| 2012/0125910 A1* | 5/2012 | Shaffer | H01H 19/62 |
| | | | 219/262 |
| 2012/0288806 A1* | 11/2012 | Racaj | F23N 5/123 |
| | | | 431/18 |
| 2013/0199512 A1* | 8/2013 | Cetintas | F23N 5/24 |
| | | | 126/39 BA |
| 2013/0252185 A1* | 9/2013 | Shaw | F24H 9/1881 |
| | | | 431/178 |

OTHER PUBLICATIONS

Partial International Search Report for PCT/US2015/046057, dated Nov. 25, 2015, 7 pages.

* cited by examiner

COMBINATION EMI SHIELD AND MOUNTING SYSTEM FOR ELECTRONIC CONTROLLED GAS COOKING

BACKGROUND OF THE INVENTION

1. Field of the Invention

The present disclosure relates to a cooking appliance and, more particularly, to an EMI shield and mounting system for gas cooking appliances.

2. Description of Related Art

Gas burners such as gas surface burners, for example, that are used with domestic gas ranges, cooktops, and similar appliances, typically include a burner body or head that includes a plurality of burner ports through which a combustible gas is distributed to the exterior of the burner body. Usually a mixing conduit introduces a mixture of a gaseous fuel and air as the combustible gas into the burner body. The gaseous fuel typically comprises natural gas (which is primarily methane), propane, butane or mixtures thereof. The gas-air mixture can be confined in combustible gas plenum within the burner body that is closed off by a burner cap. From the plenum, the combustible gas typically passes through the burner ports and is ignited by an igniter and burned.

The igniter generally requires a high voltage system to generate a spark ignition that is used to ignite the combustible gas. These high voltage systems can produce electromagnetic interference pulses when used. Lower voltage electrical control systems for ranges and cooktops in which the burners are used are sensitive to such EMI pulses from the spark ignition system. As a result, the spark igniter can disrupt or permanently damage an appliance's controls.

Some current systems utilize distance between the spark ignition system and appliance controls and/or seal parts of the high voltage circuitry of the ignition system in epoxy or a ceramic shell to help reduce the EMI. However, these systems are not practical if the high voltage circuitry cannot be placed at a distance. Additionally, the use of epoxy and ceramic shells can increase costs. Therefore, a need exists to address the above problems in a cost effective and physically efficient manner.

SUMMARY OF THE INVENTION

The following presents a simplified summary of the invention in order to provide a basic understanding of some example aspects of the invention. This summary is not an extensive overview of the invention. Moreover, this summary is not intended to identify critical elements of the invention nor delineate the scope of the invention. The sole purpose of the summary is to present some concepts of the invention in simplified form as a prelude to the more detailed description that is presented later.

According to one embodiment of the present disclosure, an electromagnetic interference (EMI) shield for gas cooktops comprises a high voltage side; and a low voltage side, wherein a transformer of a high voltage spark ignition system is mounted on a high voltage side of the EMI shield and an electronic board for controlling operation of the gas cooktop is mounted on a low voltage side of the EMI shield.

According to other embodiments of the above mentioned EMI shield, the EMI shield is substantially flat and rectangular with four walls directed upward toward the high voltage side; a plurality of gas valves are mounted on the low voltage side of the EMI shield and a plurality of gas burners are mounted on the high voltage side of the EMI shield; the EMI shield further comprises a user interface or control mount on the high voltage side; the EMI shield is made from an electrically conductive material; and/or the EMI shield further comprises a plurality of small openings to allow wires and gas lines to pass between the high voltage side of the EMI shield and the low voltage side of the EMI shield.

According to another embodiment of the present disclosure, a gas cooktop comprises an exposed top element; a hidden bottom element; and an electromagnetic interference (EMI) shield disposed between the top element and the bottom element, wherein, a transformer of a high voltage spark ignition system and at least one gas burner is mounted between the EMI shield and the top element, and an electronic board for controlling operation of the gas cooktop is mounted between the EMI shield and the bottom element.

According to other embodiments of the above mentioned gas cooktop, the EMI shield is substantially flat and rectangular with four walls directed upward toward the top element; a plurality of gas valves are mounted between the EMI shield and the bottom element and a plurality of gas burners are mounted between the EMI shield and the top element, the gas burners penetrating a plurality of openings in the top element; an area between the EMI shield and the top element is a high voltage side and an area between the EMI shield and the bottom element is a low voltage side, the transformer of the high voltage spark ignition system being mounted to the EMI shield on the high voltage side and the electronic board is mounted to the EMI shield on the low voltage side; the EMI shield comprises a user interface or control mount between the EMI shield and the top element; the EMI shield is made from a conductive material or metal; the EMI shield comprises a plurality of small openings to allow wires and gas lines to pass through; and/or a capacitor and silicon-controlled rectifier of the high voltage spark ignition system are mounted between the EMI shield and the top element, and a spark electrode is mounted on an exposed side of the top element.

These and other embodiments are described in more detail below.

DETAILED DESCRIPTION OF THE DRAWINGS

Figure 1:
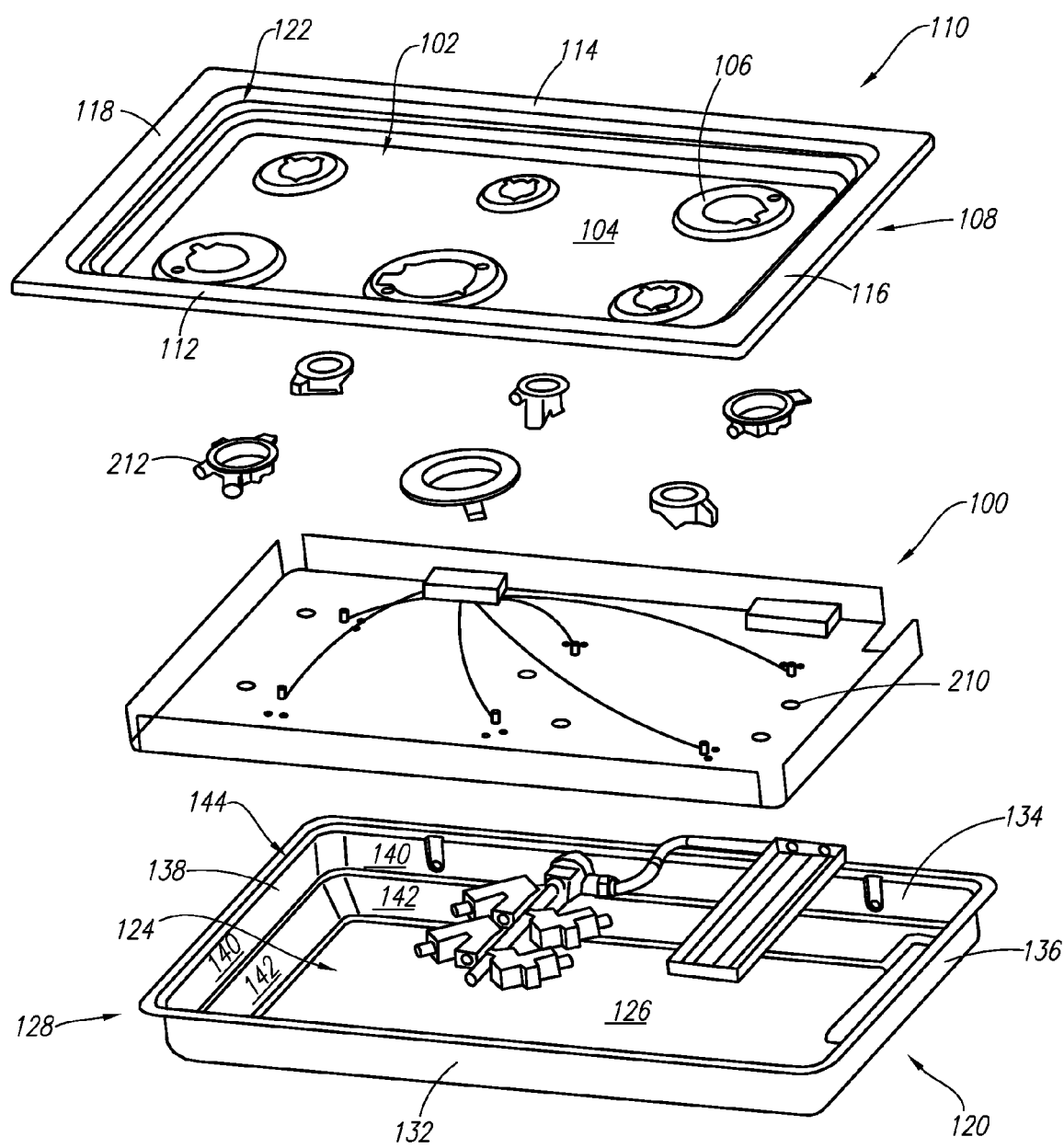
FIG. 1 illustrates the structure of a cooking appliance utilizing an EMI shield disclosed herein.

Certain terminology is used herein for convenience only and is not to be taken as a limitation on the present invention. Relative language used herein is best understood with reference to the drawings, in which like numerals are used to identify like or similar items. Further, in the drawings, certain features may be shown in somewhat schematic form.

It is also to be noted that the phrase "at least one of", if used herein, followed by a plurality of members herein means one of the members, or a combination of more than one of the members. For example, the phrase "at least one of a first widget and a second widget" means in the present application: the first widget, the second widget, or the first widget and the second widget. Likewise, "at least one of a first widget, a second widget and a third widget" means in the present application: the first widget, the second widget, the third widget, the first widget and the second widget, the first widget and the third widget, the second widget and the third widget, or the first widget and the second widget and the third widget. The term "substantially," if used herein, is a term of estimation.

The present disclosure relates to a cooking appliance. More specifically, the present disclosure relates to an EMI shield and mounting system for gas cooking appliances. Such gas cooking appliances may include cooktops, ranges, ovens, and the like. While the following disclosure will illustrate the use of an EMI shield with respect to a gas cooktop, it is important to note that such a use is not intended to be limiting.

The cooking appliance may provide heat using combustible gas and the cooktop may include one or more gas burners that are mounted to the cooktop. As illustrated in FIG. 1, an EMI shield 100 is shown in relation to other elements of a gas cooktop. A top element 110 of the cooktop includes an inner recessed area 102 and a bottom surface 104 that substantially defines the inner recessed area 102. The bottom surface 104 may be substantially flat but may include a plurality of areas that have openings, raised portions, and apertures 106 such that the gas burners, grill pieces, and the like can be mounted thereto or situated according to a particular form factor. A periphery 108 of the top element 110 may have a substantially rectangular shape so as to include a front proximal edge 112, a rear distal edge 114, and lateral edges 116, 118. The periphery 108 may be formed to include an outer recessed area 122 that is recessed relative to the periphery 108, and the inner recessed area 102 may be recessed relative to the outer recessed area 122. The periphery 108 and the outer recessed area 122 may also be substantially flat. Moreover, the periphery 108 may substantially surround the outer recessed area 122 while the outer recessed area 122 may substantially surround the inner recessed area 102.

A bottom element 120 of the cooktop also includes an inner recessed area 124 substantially defined by a bottom surface 126. The bottom surface 126 is substantially flat but may include a plurality of areas that have raised portions and apertures such that electronics, controls, gas lines, and the like can be mounted thereto. A periphery 128 of the bottom element also defines the inner recessed area 124 and is made up of four walls 132, 134, 136, and 138. Each of the four walls 132, 134, 136, and 138 comprises a top portion 140 that is substantially vertical and a bottom portion 142 that is angled inwardly toward the bottom surface. In this way, the perimeter around the top of the periphery 128 is greater than the perimeter around bottom surface 126. Further, the location around the periphery 128 where the top and bottom portions 140, 142 of the walls 132, 134, 136, and 138 meet defines a ledge upon which the EMI shield 100 may rest when the cooktop is assembled. The bottom element 120 may further comprise an outer recessed area or lip 144 around the top portion 140 of the four walls 132, 134, 136, and 138 of the periphery 128. In some embodiments, the periphery 128 may also comprise four edges that define the outer recessed area or lip 144, similar to those described with respect to the top element 110. In this way, the edges 112, 114, 116, 118 of the top element 110 may rest on the corresponding edges of the bottom element 120 when the cooktop is assembled as described below.

Figure 2:
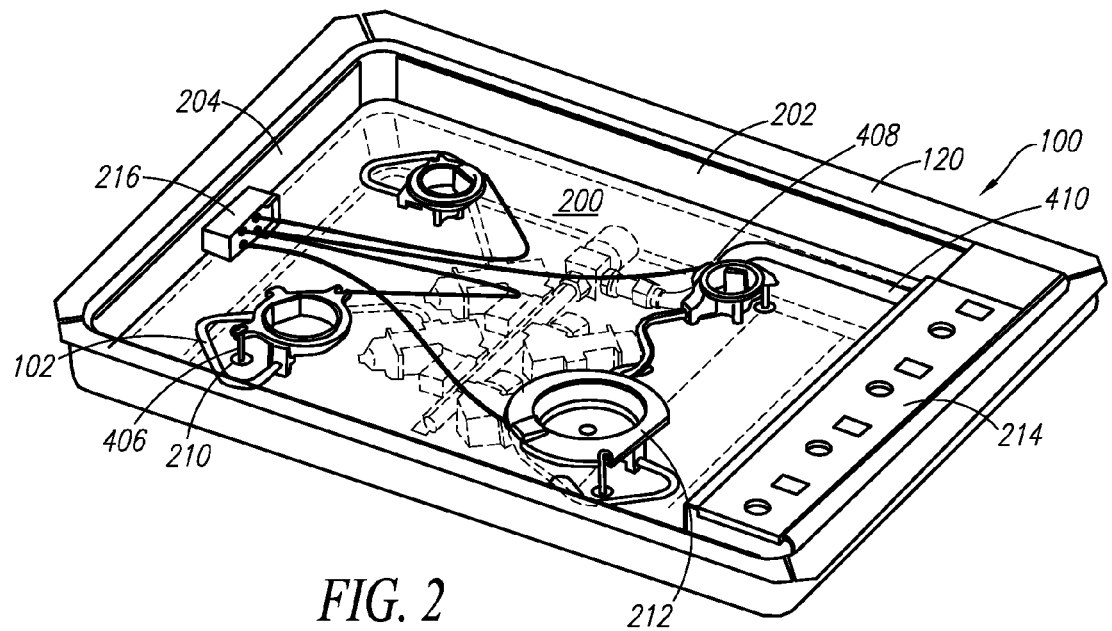
FIG. 2 is a perspective view of the top of an EMI shield disclosed herein.
Figure 3:
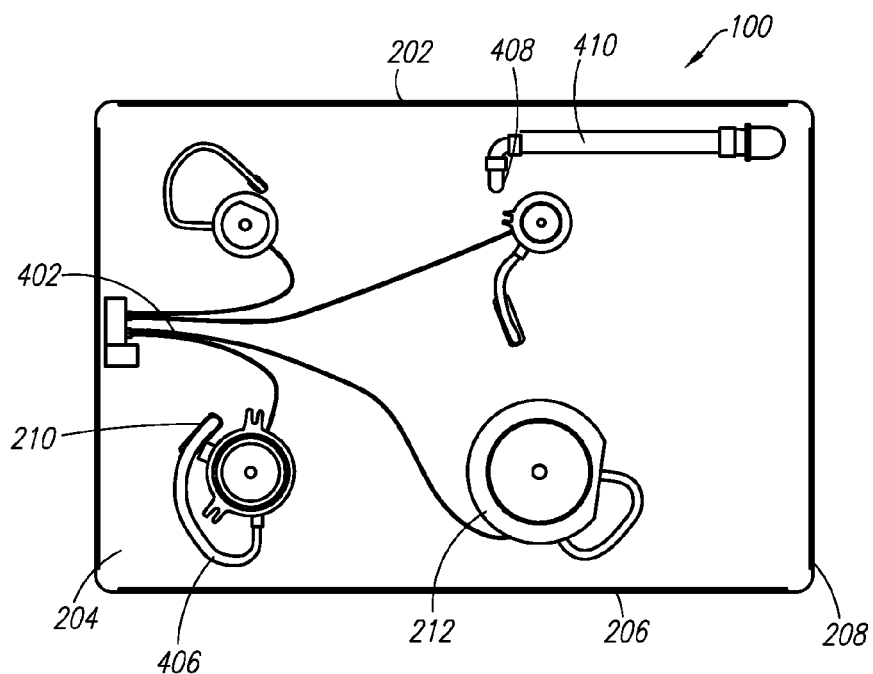
FIG. 3 is a top view of an EMI shield disclosed herein.

The EMI shield 100 and various components of the cooktop are provided between the top and bottom elements 110, 120 of the cooktop. These components and elements, and their relation to the EMI shield 100 are described in detail with regard to FIGS. 2-5. Specifically, FIGS. 2 and 3 illustrate top views of the EMI shield 100, which forms a "high voltage" side of the EMI shield 100 in the cooktop. The EMI shield 100 can be made of a metal or similar conducting material and comprises a substantially flat rectangular element 200 with four substantially vertical walls 202, 204, 206, 208 corresponding to each of the four sides of the rectangular element 200. As shown in FIG. 2, the EMI shield 100 may rest within the bottom element 120 of the cooktop. That is, the perimeter dimensions of the EMI shield 100 are substantially similar or slightly smaller to those of the top portion 140 of the periphery 128 of the bottom element 120. In this way, the EMI shield 100 may rest on the ledge defined by the angled bottom portion 142 of the periphery 128 of the bottom element 120. Additionally, the vertical walls 202, 204, 206, 208 of the EMI 100 shield are substantially similar in height to the top portion 140 of the periphery 128 of the bottom element 120. In this way, the top portion 140 of the periphery 128 of the bottom element 120 and the top of the vertical walls 202, 204, 206, 208 of the EMI shield 100 are at substantially the same height when the EMI shield 100 is set within the bottom element 120. The top element 110 may thus be placed over the EMI shield 100 to form the cooktop.

The top surface of the rectangular element 200 of the EMI shield 100 comprises a plurality of small openings 210 to allow tubing and wiring for each of a plurality of gas burners 212 to pass through from beneath the EMI shield 100. Each of the plurality of burners 212 may be mounted directly to the top surface rectangular element 200 of the EMI shield 100 by screws, brackets, welding, soldering, and the like. In the embodiments illustrated in the figures, there are six burners in FIG. 1 and four burners in FIGS. 2-5; however, any number of burners is envisioned. Moreover, the burners 212 may be of any size desired for the particular applications of the cooktop or cooking appliance without departing from the scope of the present disclosure.

For each burner, there are two openings in the rectangular element 200 of the EMI shield 100: a first opening 400 for gas tubing 402, and second opening 404 for an electrical control wire 406. There is additionally a third opening 408 for a primary gas line 410. It should be noted that the number of openings in the EMI shield 100 described and illustrated herein is not intended to be limiting. For example, tubing and wiring may be passed through a single opening for each burner, tubing for each burner may be passed through a single opening, wiring for each burner may be passed through a single opening, or any combination of shared use of openings or the like are envisioned to be within the scope of the present disclosure.

Figure 4:
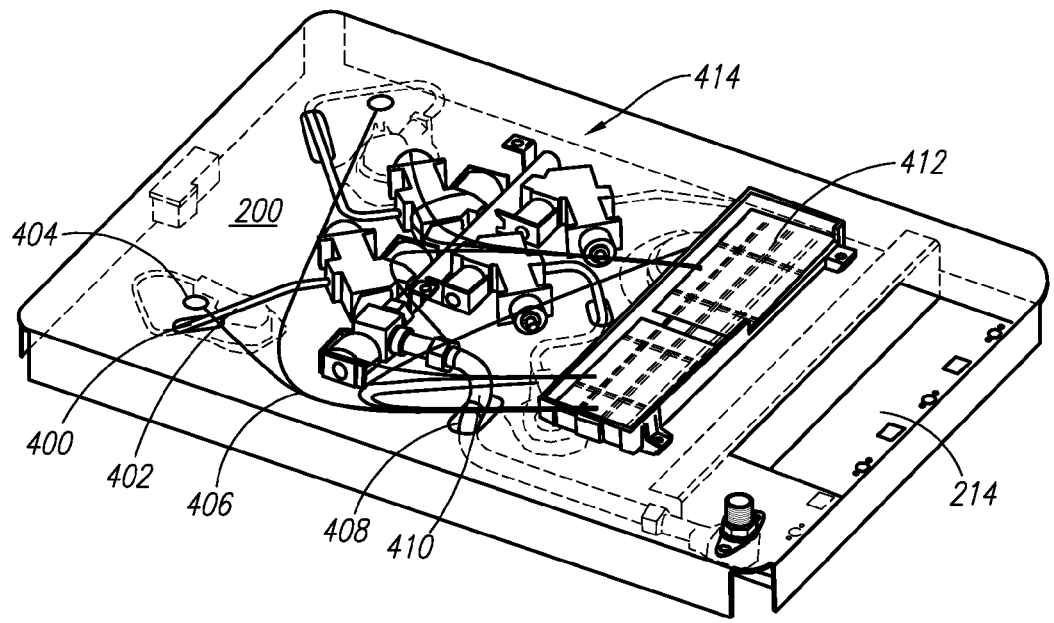
FIG. 4 is a perspective view of a bottom of an EMI shield disclosed herein.
Figure 5:
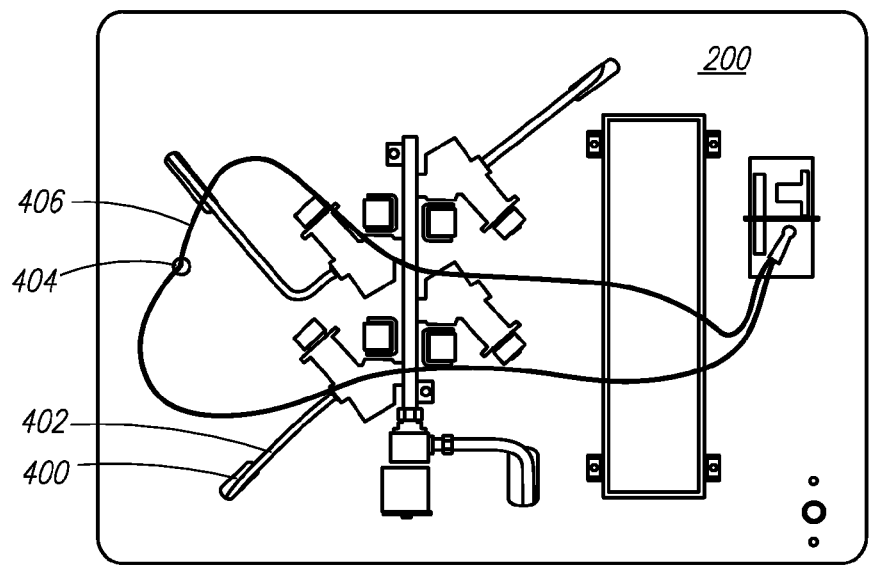
FIG. 5 is a bottom view of an EMI shield disclosed herein.

As illustrated in FIGS. 2 and 4, the top side of the EMI shield 100 may also comprise a mount 214 for controls and/or a user interface for the cooktop. For example, FIG. 2 illustrates a shelf with openings therein to mount rotary controls for each of the plurality of burners 212. Wiring to connect the rotary controls to an electronic board 412 located on a bottom surface of the EMI shield 100 may also pass through the openings. While a mount 214 for four rotary controls is illustrated, this is not intended to be a limiting element. Rather any number and type of controls may be used and/or mounted to the EMI shield while remaining within the scope of the present disclosure. Such controls may be determined based on, for example, the number of burners or the particularly desired functionalities of the cooktop. In other embodiments, touch controls may be used to control the cooktop. Such controls may be mounted on the EMI shield, on the top element of the cooktop appliance, or even independently of the EMI shield and the cooktop or similar appliance. In other words, a mount may not be required for embodiments that use touch controls (e.g., as shown in FIGS. 1, 3, and 5). In addition to controls, the mount 214 may also operate as a mount for a user interface. Such a user interface may include controls as already discussed as well as a display for providing feedback regarding the operation of the cooktop, for example, indicating the temperature or power levels of each burner. The display may also display information unrelated to the cooktop, for example, a current time. The display may be an LED display, LCD display, or the like.

A high voltage spark ignition system 216 is also mounted on the top side of the EMI shield 100. Generally, for example the high voltage spark ignition system 216 is comprised by a transformer, a capacitor, an electronic switch such as a silicon-controlled rectifier (SCR), transistor, etc., and a spark electrode. Simply, the capacitor stores a charge from a supply (e.g., at 12 or 24 V). When a spark is desired, the capacitor is discharged using the electronic switch through a primary winding of the transformer. The transformer serves to increase the discharge voltage (e.g., to 5,000-10,000 V) on a secondary side of the transformer. The secondary winding of the transformer is connected to the spark electrode which is placed at a distance according to a spark gap from a grounded conducting element. In some embodiments, the burner itself may be grounded and serve as the grounded element. Thus, a spark is generated when the voltage between the spark electrode and burner is sufficient to overcome the spark gap.

Thus, it is understood that wiring from an igniter of the spark ignition system 216 extends to each of the plurality of burners. More specifically, wiring from the transformer of the high voltage spark ignition system 216 extends to a spark electrode at each of the plurality of burners. The high voltage spark generated by the high voltage spark system 216 is provided to the burners 212 to ignite gas flowing to the burner 212 from the bottom surface of the rectangular element 200 of the EMI shield 100 through the gas tubing. In producing sparks to ignite the gas, the high voltage spark ignition system 216 produces electro-magnetic interference (EMI) pulses that can disrupt sensitive electronics used to control the cooktop, such as those contained on the electronic board 412. In other words, the high voltages (e.g., 5,000-10,000 V) produced by the high voltage spark ignition system 216 are dangerous for the sensitive electronics that operate at lower voltages (e.g., 12 or 24 V). Therefore, mounting the high voltage spark ignition 216 system on the top, "high voltage", side of the EMI shield 100 causes components beneath the EMI shield 100 to be substantially shielded from such interference as a result of its conductive properties. In certain embodiments, the EMI shield is connected to earth ground as provided by an electrical power source for the cooktop. The EMI shield can be connected to earth ground through the top and/or bottom elements 110, 120 to conduct EMI voltages or currents to ground.

FIGS. 4 and 5 show such components, illustrating the bottom, or "low voltage" side of the EMI shield in the cooktop. The bottom side of the EMI shield is defined by the substantially flat bottom surface of the rectangular element 200 of the EMI shield. A plurality of gas control valves 414 are mounted to the bottom surface of the rectangular element 200 and connected to the primary gas line 410 discussed above. A gas control valve is provided for each of the plurality of burners. The gas control valves control the flow of gas from the primary gas line to the burners through the gas tubes discussed above. At least one electronic board 412 is additionally mounted on the bottom of the shield. The electronics 412 are also connected to the plurality of gas control valves, as well as the burners, as discussed above. In other words, the cooktop is operated via controls electrically connected to the electronic board 412. Therefore, when a user operates a control, an electric signal is sent to the electronic board 412, which interprets the signal and appropriately effectuates an action in accordance with the user's control. For example, when a user operates a control to light a burner, the electronic board 412 sends a signal to the ignition system 216 to ignite the appropriate burner. In another example, when a user desires to "turn up" a burner, the electric board 412 sends a signal to the appropriate gas control valve causing the valve to open further and allow more gas to pass to the burner. Without the EMI shield 100, these controls would be susceptible to electromagnetic interference from the high voltage spark ignition system 216. However, because they are mounted on an opposite side of the EMI shield 100 than the ignition system 216, no such interference occurs and the cooktop can operate without fault.

The electronic board 412 comprises a circuit, or series of circuits, including microprocessors, for controlling the operation of the cooktop. More specifically, such an electronic board as used herein may refer to any, or part of any, electrical circuit comprised of any number of electrical components, including, for example, resistors, transistors, capacitors, inductors, and the like. The circuit may be of any form, including, for example, an integrated circuit, a set of integrated circuits, a microcontroller, a microprocessor, a collection of discrete electronic components on a printed circuit board (PCB) or the like. The processor may also stand alone or be part of a computer used for operations other than controlling the operation of the cooktop. It should be noted that the above description is non-limiting, and the examples are but only a few of many possible processors envisioned.

While various features are presented above, it should be understood that the features may be used singly or in any combination thereof. Further, it should be understood that variations and modifications may occur to those skilled in the art to which the claimed examples pertain. The examples described herein are exemplary. The disclosure may enable those skilled in the art to make and use alternative designs having alternative elements that likewise correspond to the elements recited in the claims. The intended scope may thus include other examples that do not differ or that insubstantially differ from the literal language of the claims. The scope of the disclosure is accordingly defined as set forth in the appended claims.

What is claimed is:

1. A gas cooktop comprising:
   an exposed top element;
   a hidden bottom element; and
   an electromagnetic interference (EMI) shield disposed between the top element and the bottom element,
   wherein, a transformer of a high voltage spark ignition system and at least one gas burner are mounted between the EMI shield and the top element, and an electronic board for controlling operation of the gas cooktop is mounted between the EMI shield and the bottom element.

2. The gas cooktop of claim 1, wherein the EMI shield is substantially flat and rectangular with four walls directed upward toward the top element.

3. The gas cooktop of claim 1, wherein a plurality of gas valves are mounted between the EMI shield and the bottom element and a plurality of gas burners are mounted between the EMI shield and the top element, the gas burners penetrating a plurality of openings in the top element.

4. The gas cooktop of claim 1, wherein an area between the EMI shield and the top element is a high voltage side and an area between the EMI shield and the bottom element is a low voltage side, the transformer of the high voltage spark ignition system being mounted to the EMI shield on the high voltage side and the electronic board is mounted to the EMI shield on the low voltage side.

5. The gas cooktop of claim 1, wherein the EMI shield comprises a mount to which a user interface or control can be mounted, the mount being between the EMI shield and the top element.

6. The gas cooktop of claim 1, wherein the EMI shield is made from an electrically conductive material.

7. The gas cooktop of claim 1, wherein the EMI shield comprises a plurality of small openings to allow wires and gas lines to pass through.

8. The gas cooktop of claim 1, wherein a capacitor and a silicon-controlled rectifier of the high voltage spark ignition system are mounted between the EMI shield and the top element, and a spark electrode is mounted on an exposed side of the top element.

* * * * *